United States Patent
Dings et al.

(10) Patent No.: US 8,471,278 B2
(45) Date of Patent: Jun. 25, 2013

(54) METHOD FOR MANUFACTURING AN OLED OR A BLANK FOR FORMING AN OLED AS WELL AS SUCH A BLANK OR OLED

(75) Inventors: Franciscus Cornelius Dings, Eindhoven (NL); Remco Leonardus Johannes Robertus Pennings, Eindhoven (NL); Jan Jongman, Cambridge (GB); Paul Jerram, Braintree (GB); Stephen Coats, Huntingdon (GB)

(73) Assignee: OTB Group B.V., Cambridgeshire (GB)

( * ) Notice: Subject to any disclaimer, the term of this patent is extended or adjusted under 35 U.S.C. 154(b) by 1498 days.

(21) Appl. No.: 11/794,315

(22) PCT Filed: Dec. 27, 2004

(86) PCT No.: PCT/NL2004/000916
§ 371 (c)(1),
(2), (4) Date: Dec. 17, 2007

(87) PCT Pub. No.: WO2006/071106
PCT Pub. Date: Jul. 6, 2006

(65) Prior Publication Data
US 2011/0151612 A1  Jun. 23, 2011

(51) Int. Cl.
*H01L 51/44* (2006.01)
*H01L 51/56* (2006.01)

(52) U.S. Cl.
USPC ................ 257/91; 257/E51.018

(58) Field of Classification Search
None
See application file for complete search history.

(56) References Cited

U.S. PATENT DOCUMENTS

| | | | |
|---|---|---|---|
| 7,276,326 B2 * | 10/2007 | Choi et al. | 430/321 |
| 2003/0071570 A1 | 4/2003 | Tamashiro et al. | |
| 2003/0080678 A1 | 5/2003 | Kim et al. | |
| 2003/0164674 A1 | 9/2003 | Imamura | |
| 2003/0164681 A1 | 9/2003 | Fukuoka et al. | |
| 2004/0036411 A1 | 2/2004 | Kim et al. | |
| 2004/0121602 A1 | 6/2004 | Maruyama et al. | |
| 2004/0171184 A1 | 9/2004 | Maruyama et al. | |
| 2006/0033080 A1 * | 2/2006 | Harada et al. | 252/301.16 |

FOREIGN PATENT DOCUMENTS

EP   1 191 819 A   3/2002

* cited by examiner

*Primary Examiner* — Seahvosh Nikmanesh
(74) *Attorney, Agent, or Firm* — Birch, Stewart, Kolasch & Birch, LLP (57) ABSTRACT

Method for manufacturing an organic light emitting device or a blank for forming therefrom an organic light emitting device as well as such a OLED or blank, the organic light emitting device having a light emitting area with two opposite first sides and two opposite second sides, the method comprising at least the following steps: providing a substrate; depositing and partly removing a layer of transparent conductive material on the substrate for forming parallel anode lines which extend between the first sides; depositing and partly removing at least one conductive layer for forming contacts which are connected anode lines; wherein a photoresist layer is deposited so that it fully extends over contacts adjacent the at least one second side except for at least one contact position per cathode line, via which an electric contact between a respective cathode line to be formed and a respective contact is established.

15 Claims, 4 Drawing Sheets

Fig. 8

METHOD FOR MANUFACTURING AN OLED OR A BLANK FOR FORMING AN OLED AS WELL AS SUCH A BLANK OR OLED

BACKGROUND OF THE INVENTION

1. Field of the Invention

The invention relates to a method for manufacturing a blank arranged for forming therefrom an organic light emitting device, the organic light emitting device having a light emitting area, the method comprising at least the following steps:

providing a substrate;

forming parallel anode lines which extend in a first direction; forming contacts which are connected anode lines and which are arranged for contacting cathode lines;

forming cathode separators which extend in a second direction crossing the first direction.

2. Description of Background Art

Such a method is known and the blank provided therewith can be provided with light emitting material after which the light emitting area is covered either with a cover comprising a getter or with a encapsulating layer system.

Especially when using an encapsulating layer system for closing off the light emitting area from the environment, it has been established that leakage occurs because of an insufficient quality of the encapsulating layer system. Further investigation of the reasons for the insufficient quality has revealed that the edges of the contacts are irregular and that at edges of a photoresist layer in which a bank structure comprising pixel compartments is formed, holes are present which cannot effectively be covered by the encapsulating layer system. The further investigation also revealed that the ingress of moisture and oxygen is strongest from the second sides and almost absent from the first sides.

SUMMARY OF THE INVENTION

According to the invention the method of the pre-characterising portion is characterised in that a photoresist layer is deposited so that it fully extends over the contacts which are arranged for contacting the cathode lines except for at least one contact position per cathode line, via which an electric contact between a respective cathode line and a respective contact will be established.

The invention also provides a blank for forming therefrom an organic light emitting device, the blank comprising:

a substrate;

parallel anode lines extending in a first direction;

parallel cathode separators extending in a second direction crossing the first direction;

contacts in electric contact with the anode lines and arranged for contacting cathode lines;

wherein the contacts arranged for contacting the cathode lines are completely covered by a photoresist layer except for at least one contact position per cathode line via which an electric contact between a respective cathode line and a respective contact will be established.

The photoresist layer extending fully over the contacts adjacent the at least one second side smoothes the edges of the contacts and the formation of holes as described above is prevented. Consequently, the encapsulating layer system which is deposited afterwards can easily conform to this smooth photoresist layer without being disrupted by irregular contact edges or holes as described above.

The invention also provides a method for manufacturing an organic light emitting device, the organic light emitting device having a light emitting area, the method comprising at least the following steps:

providing a blank by providing a substrate;

forming anode lines which extend in a first direction from one to another first side;

forming cathode separators which extend in a second direction from one to another second side, the second direction crossing the first direction;

forming contacts connected to the anode lines and arranged for contacting cathode lines;

wherein along at least the second sides an embankment structure is provided; and wherein after having formed the cathode lines, an encapsulating layer system is deposited, the encapsulating layer system comprising a stack of inorganic and organic layers, the encapsulation layer system being deposited after the embankment structure has been provided, the encapsulation layer system extending over an inner embankment of the embankment structure.

The invention also provides an organic light emitting device, the organic light emitting device comprising a blank comprising:

a substrate;

anode lines extending parallel in a first direction from one to another first side;

cathode separators extending parallel in a second direction from one to another second side, the second direction crossing the first direction;

contacts being in electric contact with the anode lines and arranged for contacting cathode lines;

wherein an embankment structure is provided at least along said second sides; and wherein an encapsulation layer system is deposited after the embankment structure has been provided, the encapsulation layer system extending over an inner embankment of the embankment structure.

The ingress of moisture and oxygen is most dominant in the longitudinal direction of the cathode separators. This finding has led to the insight that the cathode separators provide a barrier for moisture and oxygen in the direction transverse to the longitudinal direction of the cathode separators. In view thereof, according to the invention the embankment structure is provided along at least the second sides of the light emitting area. This embankment structure, which is preferably similar to the structure of a cathode separator in the sense that it has a similar cross section as a cathode separator, provides barrier in the direction transverse to the longitudinal direction of the cathode separators. It should be noted that also other structures and materials are possible for forming the embankment structure.

According to a further elaboration of the invention, an embankment structure may also be provided at least along said first sides.

This additional embankment structure provides additional protection against the ingress of moisture and oxygen towards the light emitting area.

According to a further elaboration of the invention the method comprises depositing an encapsulating layer system after having formed the cathode lines.

The encapsulating layer system may comprise a stack of inorganic and organic layers. Such a system, known per se, provides a very thin and effective shield against moisture and oxygen.

Preferably the encapsulating layer system extends completely over the light emitting area and the photoresist layer extending over the contacts adjacent said at least one second side and, preferably, is in direct contact with the substrate in the area surrounding the light emitting area and the contacts adjacent the at least one second side.

The embankment structure mentioned above might comprise at least two parallel embankments surrounding the light emitting area as well as the contacts adjacent the second sides and crossing the contacts which are positioned along the at least one first side and which are provided for connection with contacts of a control chip. It is also possible that the inner embankment adjacent the second sides is positioned on top of the photoresist layer that covers the contacts.

In order to obtain a effective encapsulation, it is advantageous when the embankment structure is provided directly onto the substrate.

When the encapsulation layer system extends over the embankment structure a very good mechanical connection between the encapsulation layer system and the substrate and/or embankment structure is obtained. Consequently, the risk of peeling off of the encapsulation layer system is minimized. Further, the travelling length for moisture and oxygen is increased. Additionally, moisture and oxygen will preferably flow in the longitudinal direction of the embankment structure and, consequently, not reach the light emitting area.

Especially when two parallel embankments are provided around the light emitting area, the inner embankment can be covered by the encapsulation layer system and the outer embankment can be used to form the boundary of the encapsulation layer system. The organic layers of the encapsulation layer system may be deposited in liquid form and the outer embankment will prevent that the contact parts outside the outer embankment adjacent the at least one first side are covered with organic material. These contact parts should stay clean in order to provide good electrical conductivity between the contacts of the control chip and the contacts of the light emitting device.

The invention also relates to an organic light emitting device comprising a blank according to the invention, wherein light emitting material is provided on the anode lines and cathode lines are provided over the light emitting material, an encapsulation layer system fully extending over the light emitting area and the contacts adjacent the at least one second side.

The invention also relates to an organic light emitting device, comprising a blank having said embankment structure, wherein light emitting material is provided on the anode lines and cathode lines are provided over the light emitting material, an encapsulation layer system fully extending over the light emitting area, the contacts adjacent the at least one second side, as well as an inner embankment of the embankment structure.

According to a further elaboration of the invention, the light emitting device is provided with a embankment structure which extends over contacts which are positioned along said first sides, which contacts are to be connected with a control chip, the encapsulating layer structure extending over an inner embankment of said embankment structure up to an outer embankment of said embankment structure and not extending over a part of said contacts which is outside said outer embankment.

BRIEF DESCRIPTION OF THE DRAWINGS

The invention will be further elucidated by means of a practical embodiment with reference to the accompanying drawing in which.

DETAILED DESCRIPTION OF THE INVENTION

The known OLED shown in FIGS. 1-4 has a light emitting area 1 having first sides 2 and second sides 3. The OLED comprises a substrate S from e.g. glass, transparent plastic or the like. In the light emitting area 1 parallel anode lines are provided on the substrate which extend between the first sides 2. The anode lines are preferably made of transparent conductive oxide such as ITO. Further, the substrate is provided with contacts 5, 6 which connect the anode lines and cathode lines to be formed with a connector part 7. In use, the OLED will be connected to a control chip which is connected to the connector part 7. Contacts 6 adjacent one of the first sides 2 connect the anode lines to the connector 7. Contacts 5 adjacent the two second sides 3 connect the cathode lines to the connector 7. The light emitting area is covered by a photoresist layer 4 in which pixel compartments 8 are provided. The photoresist layer 4 is indicated in the art by "bank structure". In the light emitting area 1 cathode separators 9 (see FIG. 3) are provided on the bank structure 4. The cathode separators 9 can be formed by a relatively thick layer of photoresist which is partly etched away to form the cathode separators 9 which extend between the second sides 3 of the light emitting area 1. The cathode separators 9 provide a shadowing structure, known per se, which interrupts a conductive layer to be deposited thereon. Thus parallel cathode lines are formed which extend between the second sides 3 of the light emitting area 1. The cathode lines cover the pixel compartments in the bank structure 4. Before the cathode lines are formed, the pixel compartments are filled with light emitting material (LEP) such as PPV and with an hole injection layer (HIL) that increases the light emitting effect such as PEDT, which materials are known in the art. Application of HIL and LEP can be done by inkjet printing.

Figure 1:
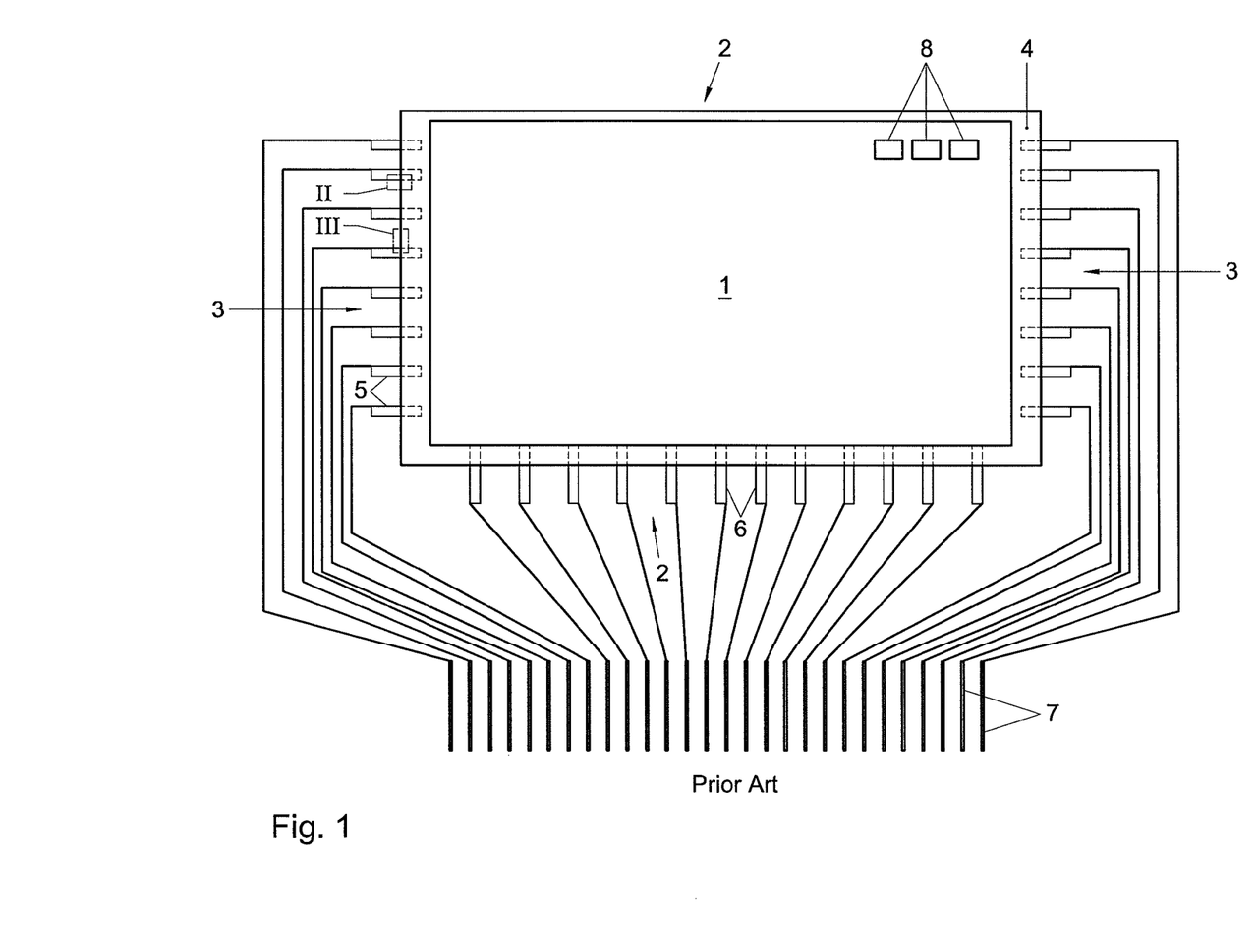
FIG. 1 shows a schematic top view of a prior art OLED (organic light emitting device)

After having deposited the HIL, the LEP and the cathode lines, the light emitting area 1 is closed off by an encapsulation layer system comprising a stack of inorganic and organic layers. In the present embodiment also the contacts area adjacent the second sides is covered by the encapsulation layer and the contacts area adjacent the first side is partly covered by the encapsulation layer.

Figure 2:
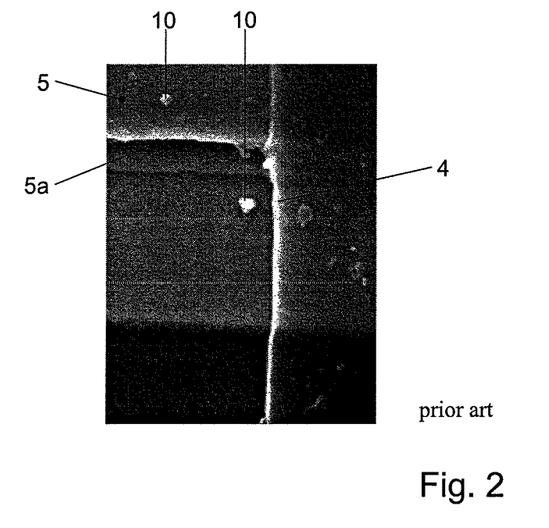
FIG. 2 shows detail II of FIG. 1.
Figure 3:
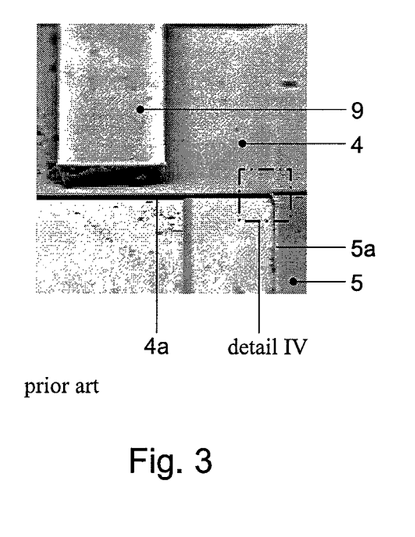
FIG. 3 shows detail III of FIG. 1.
Figure 4:
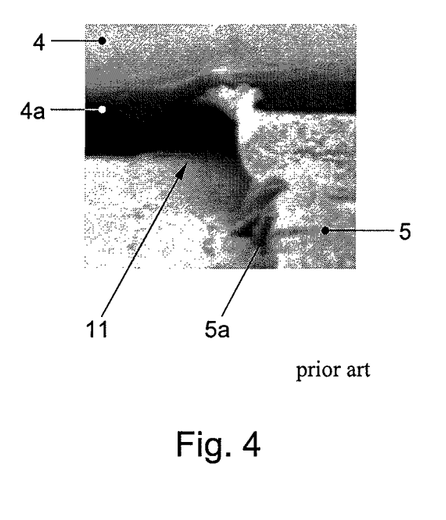
FIG. 4 shows detail IV of FIG. 3.
Figure 5:
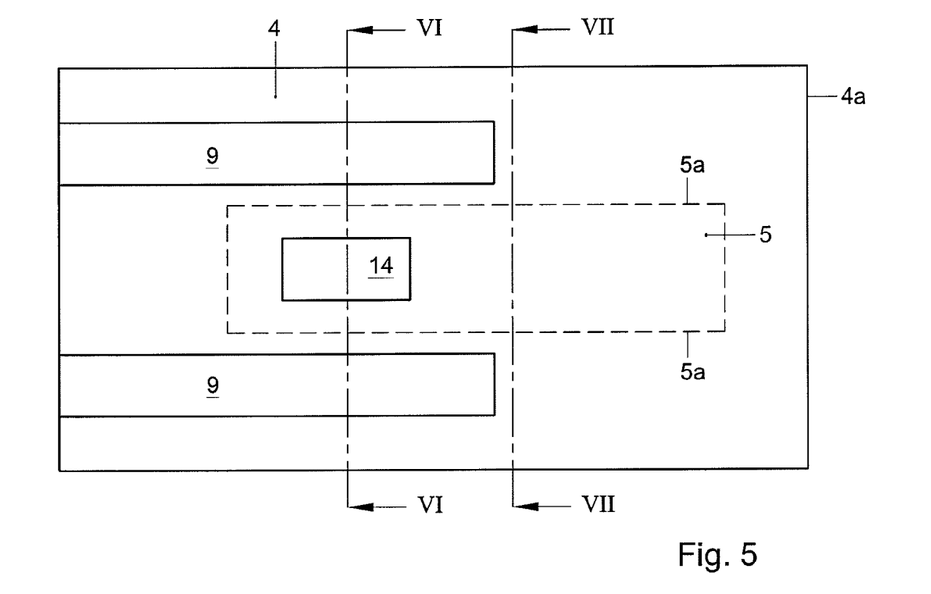
FIG. 5 shows detail V of FIG. 8.

Intensive research has revealed that a problem of the prior art device shown in FIGS. 1-4 is that ingress of moisture and/or oxygen occurs because of the fact that the encapsulation layer system does not close off the light emitting area at the edge of the bank structure 4 adjacent the second sides 3. Details II and III indicated in FIG. 1 are depicted in FIGS. 2 and 3. The research shows that the edges 5a of the metal contacts 5 are uneven and brittle. This is caused by the fact that the contacts are formed of several layers of metal alloy, e.g. MoCr, Al, MoCr which layers are etched away to form the contacts 5. Because Al etches faster than MoCr, the contacts 5 are undercut which makes the edges 5a of the contacts 5 brittle. The metal flakes 10 (see FIG. 2) can lead to damage of the encapsulation layer structure to be subsequently formed. It should be noted that also etched layers for forming the anode lines or contacts made from different materials are sometimes uneven which can lead to similar problems. Further, as shown in FIGS. 2 and 3, at the crossings of the edge 4a of the bank structure 4 and the edge 5a of a metal contact 5 a hole 11 is formed. The hole 11 cannot effectively be closed off by an encapsulation layer system and moisture and oxygen will ingress through the holes 11 to the light emitting area 1.

These problems are solved with the embodiment shown in FIGS. 5-8. In this device the photoresist layer 4 forming the bank structure 4 is enlarged relative to the layer in the device according to the prior art, i.e. to the effect that it fully extends over contacts 5 adjacent the at least one second sides 3 except for a contact position 14 (see FIGS. 5 and 6) per cathode line to be formed, via which an electric contact between a respective cathode line to be formed and a respective contact 5 is established. By this feature, the brittle edges 5a of the contacts 5 are made smooth and the holes 11 are covered. Consequently, the encapsulation layer structure to be deposited subsequently will more easily conform and the risk of disruption of the encapsulation layer structure is minimized. Closing off of the sides 3 is of the utmost importance because moisture will penetrate very quickly along the cathode separators 9 into the light emitting area 1. This will immediately lead to loss of the OLED.

In the direction transverse to the longitudinal direction of the cathode separators 9 risk of the ingress of moisture is much smaller. In view thereof, the bank structure 4 only partly covers the contacts 6 adjacent the first side 2 so that parts of those contacts remain uncovered and can serve as a connector 7 for electrical connection to a control chip.

Figure 6:
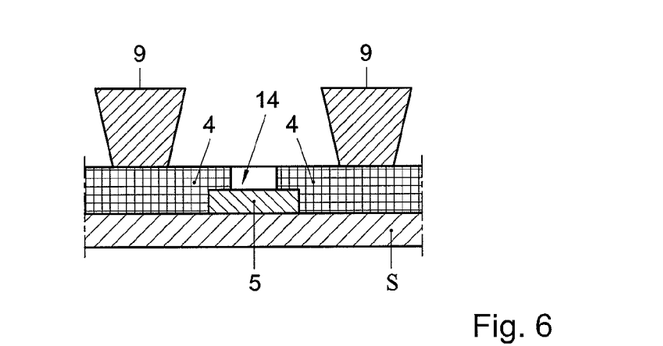
FIG. 6 shows cross section VI-VI of FIG. 5.
Figure 7:
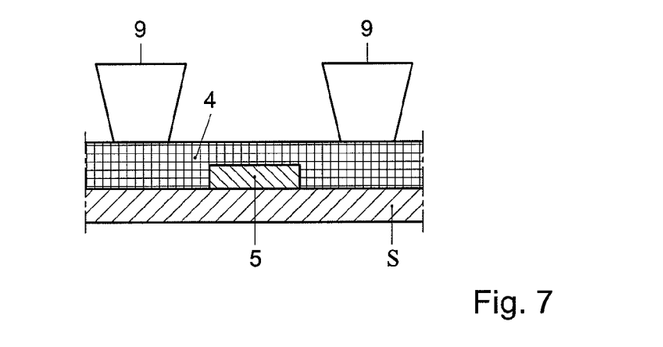
FIG. 7 shows cross section VII-VII of FIG. 5.
Figure 8:
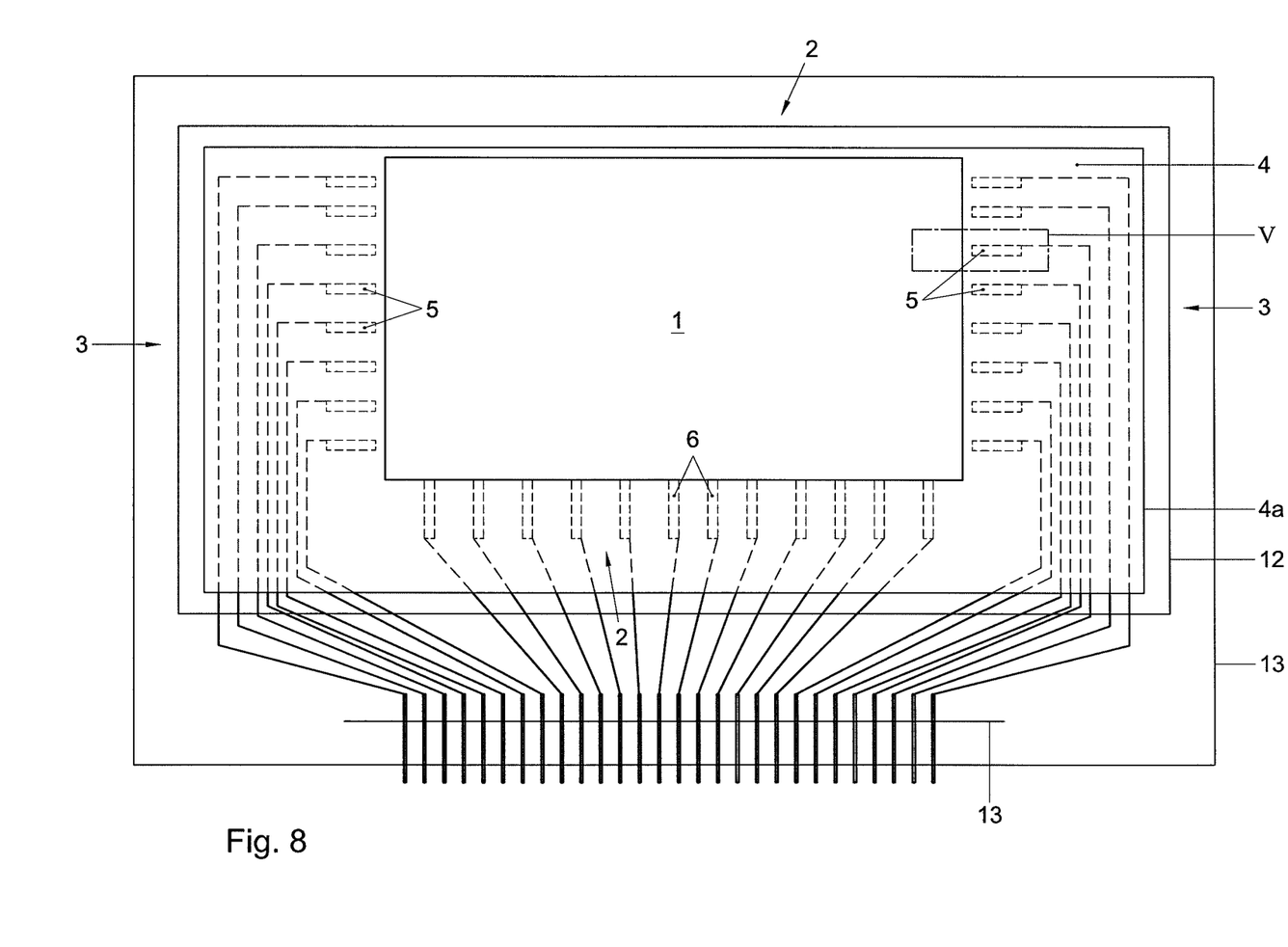
FIG. 8 shows a schematic top view of an embodiment of the OLED according to the invention.

In order to further improve the durability of the OLED use has been made of the observation that moisture and/or oxygen ingress in most cases occurs in the longitudinal direction of the cathode separators 9. In the embodiment of FIGS. 5-8, an embankment structure 12, 13 has been provided along the second sides 3. In this embodiment the embankment structure also extends along the first sides 2. The embankments of the embankment structure have a similar configuration as the cathode separators 9 in the sense that the cross section of an embankment is substantially the same as the cross section of a cathode separator, i.e. a undercut configuration as shown in FIG. 6. Preferably, the embankment structure is made in the same process steps as the cathode separators 9. Without adding any further steps an end result is obtained which has a considerable better durability. Alternatively, it is also possible that the embankment structures 12, 13 are applied in a separate manufacturing step using other materials and shapes than used for the cathode separators. The embankment structure 12, 13 provides a barrier for moisture and oxygen and dictates a preferred transport direction for the moisture and the oxygen, i.e. in the longitudinal direction of the embankment structure parallel to the edges of the light emitting area 1. Further, the embankment structure increases the travel length for the moisture and the oxygen towards the light emitting area. The embankment structure preferably includes at least an inner embankment 12 and an outer embankment 13. Preferably the encapsulating layer structure extends over at least the inner embankments 12. This improves the mechanical connection between the encapsulation layer structure and the substrate. Especially when the embankment structure 12 over which the encapsulation extends, like the cathode separators 9, have undercut portions, the connection between the encapsulating layer structure and the substrate is improved. Adjacent the first side 2 of the light emitting area 1, the inner embankment 12 extends over the contacts 6. The encapsulation layer structure extends over the inner embankments 12 and up to the outer embankment 13 so that the part 7 of the contacts 6 which is outside the outer embankment structure 13 is not covered and can serve for connection to a control chip for controlling the OLED. The outer embankment structure 13 thus serves to stop the flow of liquid when applying the organic layers of the encapsulating layer structure. In fact, the outer embankment structure 13 confines the area in which the liquid of the encapsulating layer structure has to be applied. This keeps the scribe area, i.e. the area where the OLEDS are separated by cutting the substrate in separate parts, free from unwanted materials which would make the separation, when present, more difficult.

It will be clear that the invention is not limited to the described embodiment but that also other embodiments are covered as long as these other embodiments fall within the scope of the claims.

The invention claimed is:

1. Blank for forming therefrom an organic light emitting device, the blank comprising:
   a substrate including an area having two opposite first sides and two opposite second sides;
   parallel anode lines extending in a first direction between the two opposite first sides of the area;
   parallel cathode separators extending in a second direction that crosses the first direction, the cathode separators extending between the two opposite second sides of the area;
   first contacts positioned adjacent at least one of the two opposite first sides, the first contacts being in electric contact with the anode lines; and
   second contacts positioned adjacent at least one of the two opposite second sides, the second contacts being arranged for contacting cathode lines that will be applied later and extend between the parallel cathode separators,
   wherein the second contacts are completely covered by a photoresist layer except for at least one contact position per cathode line, the at least one contact position per cathode line being formed by an opening in the photoresist layer, and the second contacts comprise edges that are completely covered by the photoresist layer and not exposed via the opening, and
   wherein an electric contact between a cathode line that will be applied and an associated second contact is established via the opening.

2. Organic light emitting device, the organic light emitting device comprising a blank comprising:
   a substrate including an area having two opposite first sides and two opposite second sides;
   anode lines extending parallel in a first direction between the two opposite first sides;
   cathode separators extending parallel in a second direction between the two opposite second sides, the second direction crossing the first direction;
   first contacts positioned adjacent at least one of the two opposite first sides, the first contacts being in electric contact with the anode lines; and
   second contacts positioned adjacent at least one of the two opposite second sides, the second contacts being arranged for contacting cathode lines;
   an embankment structure provided at least along said second sides and including at least an inner embankment; and
   an encapsulation layer system deposited after the embankment structure has been provided, the encapsulation layer system extending over the inner embankment of the embankment structure.

3. Organic light emitting device according to claim 2, wherein an embankment structure is provided at least along said first sides.

4. Organic light emitting device according to claim 2, wherein the embankment structure is formed from the same layer as the cathode separators.

5. Organic light emitting device according to claim 2, wherein the embankment structure comprises a cross section which is the same as the cross section of a cathode separator.

6. Organic light emitting device according to claim 2, wherein the embankment structure along said second sides is provided directly onto the substrate.

7. Organic light emitting device according to claim 3, wherein, along said first sides along which contacts are positioned to be connected with a control chip, the embankment structure extends over said contacts.

8. Blank according to at least claim 1, wherein the photoresist layer extending over the contacts also provides a bank structure defining pixel compartments.

9. Blank according to claim 1, wherein the cathode separators are formed from a photoresist layer which is partly removed.

10. Organic light emitting device according to claim 2, wherein the cathode separators are formed from a photoresist layer which is partly removed.

11. Organic light emitting device according to claim 2, wherein light emitting material is provided on the anode lines and cathode lines are provided over the light emitting material, an encapsulation layer system fully extending over the light emitting area and the contacts adjacent at least one of the second sides.

12. Organic light emitting device according to claim 3, wherein light emitting material is provided on the anode lines and cathode lines are provided over the light emitting material, an encapsulation layer system fully extending over the light emitting area, the contacts adjacent the at least one second side, as well as an inner embankment of the embankment structure.

13. Organic light emitting device according to claim 11, wherein the encapsulating layer system is in direct contact with the substrate in the area surrounding the light emitting area and the contacts adjacent the at least one second side.

14. Organic light emitting device according to claim 11, the encapsulating layer system extending over the light emitting area, the contacts adjacent the at least one second side, as well as an inner embankment of the embankment structures along said first and said second sides.

15. Organic light emitting device according to claim 13, wherein, along said first sides, along which contacts are positioned to be connected with a control chip, an embankment structure is provided extending over said contacts, the encapsulating layer structure extending over an inner embankment of said embankment structure up to an outer embankment of said embankment structure and not extending over a part of said contacts which is outside said outer embankment.

* * * * *

UNITED STATES PATENT AND TRADEMARK OFFICE
CERTIFICATE OF CORRECTION

| | | |
|---|---|---|
| PATENT NO. | : 8,471,278 B2 | Page 1 of 1 |
| APPLICATION NO. | : 11/794315 | |
| DATED | : June 25, 2013 | |
| INVENTOR(S) | : Franciscus Cornelius Dings et al. | |

It is certified that error appears in the above-identified patent and that said Letters Patent is hereby corrected as shown below:

ON THE TITLE PAGE:

Item (73), Assignee, change:

"(73) Assignee: OTB Group B.V., Cambridgeshire (GB)"

to

--(73) Assignees: OTB Group B.V., Eindhoven (NL); Cambridge Display Technology Limited, Cambridgeshire (GB)--.

Signed and Sealed this
Twelfth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,471,278 B2  Page 1 of 1
APPLICATION NO. : 11/794315
DATED : June 25, 2013
INVENTOR(S) : Dings et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1673 days.

Signed and Sealed this
Eighth Day of September, 2015

Michelle K. Lee
*Director of the United States Patent and Trademark Office*